United States Patent [19]

Hu

[11] 4,366,555

[45] Dec. 28, 1982

[54] ELECTRICALLY ERASABLE PROGRAMMABLE READ ONLY MEMORY

[75] Inventor: Chenming Hu, Hercules, Calif.

[73] Assignee: National Semiconductor Corporation, Santa Clara, Calif.

[21] Appl. No.: 174,770

[22] Filed: Aug. 1, 1980

[51] Int. Cl.³ ............................................. G11C 11/40
[52] U.S. Cl. ..................................... 365/185; 365/104
[58] Field of Search ......................... 365/104, 185, 182

[56] References Cited

U.S. PATENT DOCUMENTS 4,282,446  8/1981  McElroy ............................. 365/185

OTHER PUBLICATIONS

IEEE Transactions on Electron Devices-vol. ED 23, No. 4, Apr. 1976, pp. 379-387.

Primary Examiner—James W. Moffitt
Attorney, Agent, or Firm—Neil B. Schulte; Gail W. Woodward; James A. Sheridan

[57] ABSTRACT

An Electrically Erasable Programmable Read-Only Memory (EEPROM) requires only a single voltage applied to a single control gate for both erasing and writing operations. Writing is accomplished by hot channel electron injection to charge the floating gate of a selected device with electrons. Nonselected devices are kept from charging by either floating their sources or grounding their gates. Devices are erased by grounding the source and drain regions and causing the electrons stored in the floating gates to tunnel to the control gate. Preferred ratioing of the intra-device capacitances prevents erasure of nonselected devices during writing.

15 Claims, 2 Drawing Figures

ELECTRICALLY ERASABLE PROGRAMMABLE READ ONLY MEMORY

BACKGROUND OF THE INVENTION

1. Field of the Invention

The present invention relates to the field of semiconductor memories. More specifically, the present invention relates to an electrically erasable programmable read-only memory (EEPROM) having a floating gate wherein information is stored in the form of an electrical charge on the floating gate.

2. Brief Description of the Prior Art

Field effect type metal-oxide-semiconductor (MOS) devices having floating gates have been utilized as semiconductor memories in the prior art. One such device is shown in U.S. Pat. No. 3,500,142 (Kahng) which teaches the use of a tunneling phenomena through thin oxide layers to charge a floating gate. Another device shown in U.S. Pat. No. 3,660,819 (Frohman-Bentchkowsky) utilizes an avalanche injection phenomena for charging the floating gate. Further, the devices taught in U.S. Pat. Nos. 3,984,822 (Simko I), 4,099,196 (Simko II) and 4,119,995 (Simko III) disclose floating gate devices which include a second gate or control gate and utilize hot carrier injection of channel electrons to charge the floating gate.

In addition to being electrically programmable, some of these devices are also electrically erasable. Particularly, the Kahng and Simko patents teach such electrically erasable PROMs (EEPROMs). However, these prior art EEPROM devices require either two different voltages, sometimes even of opposite polarities, to be applied to the control gate during writing and erasing or, alternatively, require the use of two distinct control gates to distinguish between the writing and erasing operations.

SUMMARY OF THE INVENTION

An EEPROM memory array floats the sources of non-selected columns and grounds the control gates of nonselected rows to prevent writing in nonselected memory cells. By combining this technique with proper ratioing of the intra-device capacitances an EEPROM is provided which is characterized by a single control gate and the same applied control gate voltage for either writing or erasing.

DETAILED DESCRIPTION OF THE PREFERRED EMBODIMENT

Figure 1:
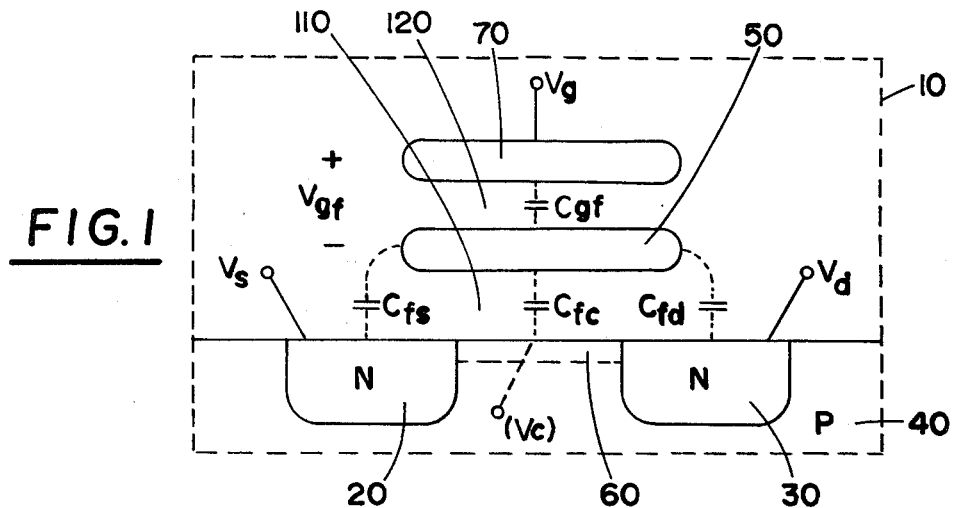
FIG. 1 is a detailed cross-sectional drawing of an electrically erasable programmable read-only memory (EEPROM) device constructed in accordance with the present invention.

FIG. 1 is a detailed cross-sectional drawing of an electrically erasable programmable read-only memory (EEPROM) device 10 constructed in accordance with the present invention. N-type source and drain regions, 20 and 30 respectively, are formed in a P-type substrate 40. A floating gate 50 is capacitively coupled to source and drain regions 20 and 30 and to a channel region 60 between source region 20 and drain region 30. A control gate 70 is capacitively coupled to floating gate 50 for direct control of channel region 60. In operation, floating gate 50 of memory device 10 can be charged (programmed) or discharged (erased) by the application of appropriate voltages to source region 20, control gate 70 and drain region 30.

Memory device 10 is an enhancement device, thus there is no inverted channel region 60 formed when a zero voltage level is applied to control gate 70 and no current is conducted between the source and drain regions in this mode of operation. The application of a positive voltage to control gate 70 may induce an inversion channel 60 resulting in conduction between the source and drain regions, depending on the charge on floating gate 50. If no negative charge is stored on floating gate 50, the application of a positive voltage to control gate 70 results in the formation of a channel region 60 and conduction between source and drain regions 20 and 30. However, if floating gate 50 is charged negatively with electrons during a writing operation to be explained in more detail below, the effective threshold voltage of the memory cell is raised and the positive voltage applied to control gate 70 is insufficient to create a channel region 60 and no conduction occurs between the source and drain regions. Thus, memory device 10 selectively conducts or does not conduct between the source and drain regions in response to the quantity of negative charge on floating gate 50.

Figure 2:
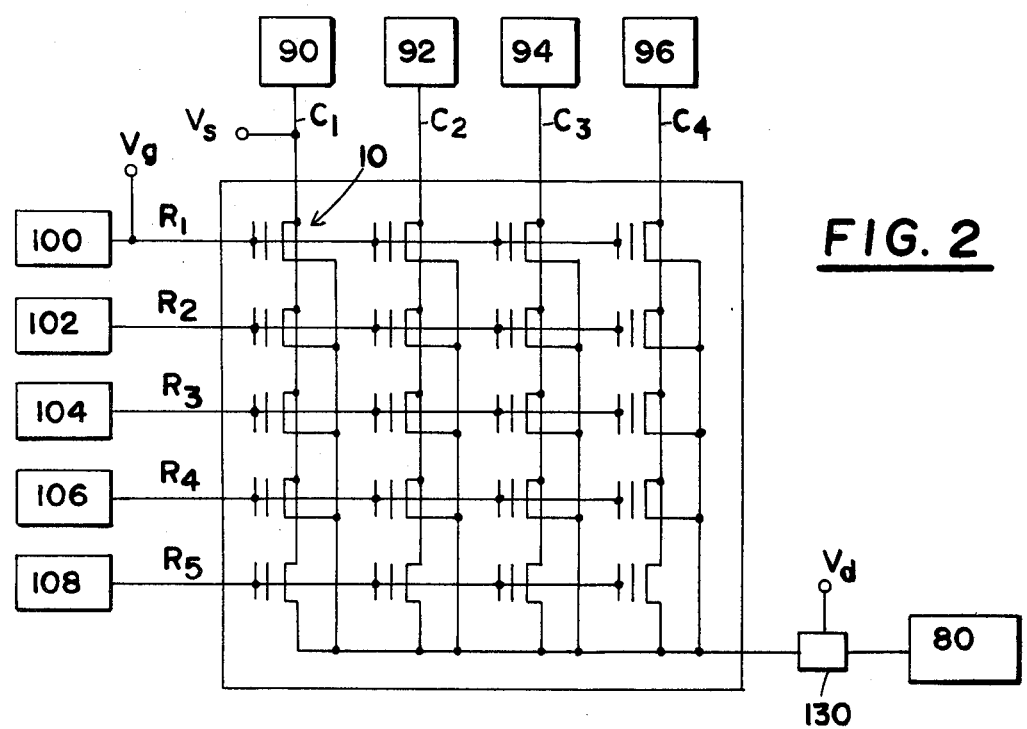
FIG. 2 is a detailed schematic diagram of a memory array of the memory devices of FIG. 1.

Memory device 10 and other identical memory devices are coupled in a memory array illustrated in the detailed schematic diagram of FIG. 2. Drain regions 30 of the memory devices are coupled together to a drain voltage supply 80 to receive a drain voltage $V_d$. The memory devices are arranged in a matrix of rows and columns with the devices of each column having their source regions 20 coupled together. The devices in the first column illustrated in FIG. 2 have their source regions coupled to a common column line C1 to receive of a voltage $V_s$ provided by column voltage supply 90. Similarly, the devices in the other columns of the memory array have their source regions coupled to column lines C2, C3 and C4 respectively. Column lines C2, C3 and C4 are then coupled to column voltage supplies 92, 94, and 96 respectively. The control gates of the memory devices in each row are coupled to common row lines which are controlled by row voltage supplies. Specifically, the control gates of the devices on common row conductors R1, R2, R3, R4 and R5 are coupled to row voltage supplies 100, 102, 104, 106, and 108 respectively.

In operation, memory device 10 can be caused to operate in one of three different modes. In a write mode, electrons are selectively injected into floating gate 50. In an erase mode, electrons are discharged from the floating gate by tunneling from the floating gate to a positively charged control gate. In a read mode the superimposed effects of a smaller control gate voltage and the charge on the floating gate may or may not create an inverted channel region 60. Thus, presence or absence of a current through the device determines the content of memory device 10.

More specifically, in the write mode of operation, a 25-volt signal is applied to control gate 70. A 17-volt signal is applied to drain region 30 and source region 20 is coupled to a zero volt ground. Assuming that floating gate 50 initially starts at a voltage of approximately 14 volts, electrons flowing in channel 60 created by the control gate voltage $V_g$ are accelerated towards drain region 30 and are injected into insulating layer 110 between channel 60 and floating gate 50 by hot channel injection. These electrons are then drawn to floating gate 50 by the electric field created by control gate 70 and gradually charge the floating gate to a voltage of approximately 9 volts. When the control gate voltage $V_g$ is removed, the floating gate falls to a voltage of approximately $-5$ volts. Thus, since memory device 10 is an enhancement device, no channel is formed unless a positive voltage is applied to control gate 70 sufficient to overcome the stored charge on the floating gate.

During a read operation, explained in more detail below, a 5-volt signal is applied to control gate 70. The device conducts, that is, the combined effect of the neutral charge on floating gate 50 and the voltage on control gate 70 causes an inversion in channel 60. If, however, floating gate 50 has been negatively charged with electrons, the five-volt signal $V_g$ applied to control gate 70 is insufficient to overcome the negative charge on floating gate 50 and no channel is created. Thus, the memory device is non-conducting.

In this present embodiment, data can be selectively written to a single memory device. Specifically, hot carrier injection from the channel charges up the floating gate and causes a shift in the threshold voltage of the selected memory device. If it is desired to write to memory device 10 on row R1 and column C1, a 25-volt signal is applied to row line R1, and column line C1 is grounded, and the common drain voltage $V_d$ is set at 17 volts. The non-selected row lines R2, R3, R4 and R5 are grounded. The absence of a positive control gate voltage to the memory devices associated with the non-selected rows results in no channel inversion, thus no channel hot electron injection occurs in these devices. Nonselected column lines C2, C3 and 4 are floated. Thus for each device on selected row $R_1$ a transient channel is formed and an initial current flows to source region 20. Source 20 quickly charges to the 17 volts applied to drain region 30 and the current stops. The short transient hot electron injection condition is of insufficient duration to charge the floating gate; thus, only the floating gate of the selected device 10 is negatively charged during the write operation.

The memory devices are erased by grounding all of the source and drain regions and applying a 25-volt signal $V_g$ to the selected row lines. Any electrons stored in the floating gates tunnel through dielectric layer 120 between floating gate 50 and control gate 70 as a result of the strong electrical field that is generated and the floating gates of the selected rows are discharged.

During a read operation of selected memory device 10, a five-volt signal is applied to row line $R_1$ associated with the memory device. A two-volt signal is applied to column line C1 and source region 20. The drain is coupled to a current sensing amplifier 130 and is held at a virtual ground. The presence or absence of a current corresponds to the absence or presence of electrons stored on floating gate 50. Voltages on the drain and source regions are reversed from those of the write operation during this read operation. That is, the voltage on source region 20 is more positive than the voltage on drain region 30. This is distinct from the constant definition of source and drain, wherein the source of an n-channel device is defined as the n+ region with the most negative potential. However, it is equivalent to applying the two-volt signal to the drain and grounding the column line C1 since it is the presence of the channel and a current, not the direction of the current flow, which is indicative of the charge on the floating gate.

The sense amplifier can be coupled anywhere in the current path. For example, in an alternative embodiment the sense amplifier is positioned at the source side rather than at the drain side of the memory devices. Specifically, there can be one sense amplifier associated with each column or one sense amplifier can be selectively connected to any one of the column lines and shared by the columns.

In the prior art, in order to keep nonselected columns from discharging during the write operation, the write voltage is kept lower than the erase voltage applied to the control gate. With the present invention, in order to apply the same or substantially the same voltage to the gate during both erasing and writing without causing unintentional erasing during writing, the voltage $V_{gf}$ between control gate 70 and floating gate 50 must be smaller during writing than during erasing, in spite of the presence of the same voltage to the control gate. This is accomplished in the present invention by properly adjusting the capacitances between the floating gate and the other parts of the cell. With the exception of the selected cell, $V_{gf}$ is only half as large during writing as during erasing. The sources of nonselected devices are floated during writing. Thus, the erasure of cells in non-selected columns during writing is prevented. Also, the control gates of non-selected devices are grounded during writing. Thus, the erasure of cells in nonselected rows during writing is prevented. For a selected cell, a somewhat higher erasure rate is acceptable as long as the rate is less than the charge injection rate during writing.

If the control gate to floating gate capacitance $C_{gf}$ is too small, most of the voltage applied to control gate 70 appears between the control gate and floating gate and nonselected columns might be inadvertently erased during a write operation. If the control gate to floating gate capacitance $C_{gf}$ is too large, it is hard to erase the charge from floating gate 50 when desired. In the present embodiment, the capacitances between floating gate 50 and source region 20, $C_{fs}$, the capacitance between floating gate 50 and channel 60, $C_{fc}$, and the capacitance between floating gate 50 and drain region 30, $C_{fd}$, are approximately equal (within 50%). The capacitance $C_{gf}$ between floating gate 50 and control gate 70 is approximately equal to (within 50%) the sum of the other three ($C_{gf}=3C_{fs}$). If $C_{fd}$ is larger and/or $C_{gf}$ and $C_{fs}$ are smaller, the difference between the $V_{gf}$ during erasure and writing will be even larger. If desired, the floating gate can be adjusted in location relative to the source and drain regions to change the ratio of the capacitances $C_{fs}$ to $C_{fd}$.

Table 1 shows the typical voltages applied to the control gate ($V_g$), the drain region ($V_d$), and the source region ($V_s$) of memory device 10 and the estimated voltages in the channel ($V_c$) and the estimated threshold voltage ($V_{th}$) and the estimated voltage differential ($V_{gf}$) between the control gate and the floating gate.

TABLE 1

| | All Units in Volts | | | |
|---|---|---|---|---|
| | | WRITE | | |
| | Erase | Selected Cell | Unselected Column | Unselected Row |
| $V_g$ | 25 | 25 | 25 | 0 |
| $V_d$ | 0 | 17 | 17 | 17 |
| $V_s$ | 0 | 0 | 17 | 0 |

TABLE 1-continued

| | All Units in Volts | | | |
| --- | --- | --- | --- | --- |
| | | WRITE | | |
| | Erase | Selected Cell | Unselected Column | Unselected Row |
| | | | (floating) | (floating) |
| $V_c$ | 0 | 12 | 17 | 10 |
| $V_{th}$ | 0–6 | 0–6 | 0–6 | 0–6 |
| $V_{gf}$ | 12.5–15.5 | 7.7–10.7 | 4–7 | −4.5-−1.5 |

While the invention has been particularly taught and described with reference to the preferred embodiments, those versed in the art will appreciate that minor modifications in form and detail may be made without departing from the spirit and scope of the invention. For instance, the drains of the memory devices could be selectively coupled to provide for selective erasure of individual devices or the entire array could be constructed of p-channel rather than n-channel devices. Accordingly, all such modifications are embodied within the scope of this patent and properly within our contribution to the art and are particularly pointed out by the following claims.

We claim:

1. An EEPROM memory array of floating gate field effect semiconductor devices, each device having a floating gate and a control gate modulating conduction in a channel between source and drain regions, the devices organized in a matrix of columns and rows, the sources of devices on each column coupled to a common column conductor, the control gates of devices on each row coupled to a common row conductor, and the drains of all devices coupled to a common drain conductor, the array further comprising:
   means for sensing conduction in the semiconductor devices; and
   means for selectively floating common column conductors so as to program the array.

2. An EEPROM memory array as in claim 1 wherein the means for sensing conduction comprises a current detector selectively coupled to one of the common column conductors.

3. The array of claim 1 including means to apply a positive voltage to said common drain conductor during programming.

4. The array of claim 1 in which said means for selectively floating common column conductors comprises means to ground the column conductor for the column containing the selected device to be programmed and means to float all other column conductors.

5. The array of claim 4 including means to apply a positive voltage to said common drain conductor during programming.

6. An array as in claim 1 further comprising means for selectively applying either a first voltage or a ground voltage to the common drain conductor for programming or reading respectively.

7. An EEPROM memory array as in claim 6 further comprising means for selectively applying either a second, third or a ground voltage to each common row conductor, and a fourth or a ground voltage to the common column conductors, the second voltage being greater than the first voltage, the third voltage less than one-half the second voltage, and the fourth voltage less than the third voltage.

8. An EEPROM memory array as in claim 7 wherein the first voltage is approximately 17 volts, the second voltage is approximately 25 volts, the third voltage is approximately 5 volts and the fourth voltage is approximately 2 volts.

9. An EEPROM memory array as in claim 1 wherein the means for sensing conduction comprises a current detector coupled to the common drain conductor.

10. An EEPROM memory array as in claims 1 or 9 wherein the source-to-floating gate capacitance, the floating gate-to-channel capacitance and the floating gate-to-drain capacitance are approximately equal.

11. An EEPROM memory array as in claim 10 wherein the floating gate-to-control gate capacitance is approximately equal to the sum of the capacitances between the source and floating gate, channel and floating gate, and drain and floating gate.

12. An EEPROM memory array as in claim 11 wherein the semiconductor devices are n-channel devices.

13. A method for operating an EEPROM memory array of the type having floating gate field effect semiconductor devices arranged in rows and columns with the sources of devices in each column coupled to a common column conductor and the control gates of the devices in each row coupled to a common row conductor and all the drains connecting to a common drain; the method comprising the steps of:
   charging a selected device by applying a first voltage to the common drain, applying a second voltage to the common row conductor of the selected device, applying a ground voltage to the other common row conductors, applying a ground voltage to the common column conductor of the selected device, and floating the other common column conductors;
   reading the selected device by applying a third voltage to the common row conductor of the selected device, applying a fourth voltage between the common source conductor and the drain of the selected device, and detecting the current flowing through the selected device, and
   erasing the selected device by applying the second voltage to the control gate and applying the ground voltage to the drain and source.

14. A method as in claim 13 wherein the second voltage is greater than the first voltage, the third voltage is less than one-half the second voltage, and the fourth voltage is less than the third voltage.

15. A method as in claim 14 wherein the first voltage is approximately 17 volts, the second voltage is approximately 25 volts, the third voltage is approximately 5 volts, and the fourth voltage is approximately 2 volts.

* * * * *